(12) United States Patent
Kishi

(10) Patent No.: US 10,727,441 B2
(45) Date of Patent: Jul. 28, 2020

(54) DISPLAY DEVICE

(71) Applicant: JOLED INC., Tokyo (JP)

(72) Inventor: Yuki Kishi, Tokyo (JP)

(73) Assignee: JOLED, INC., Tokyo (JP)

( * ) Notice: Subject to any disclaimer, the term of this patent is extended or adjusted under 35 U.S.C. 154(b) by 0 days.

(21) Appl. No.: 16/456,458

(22) Filed: Jun. 28, 2019

(65) Prior Publication Data

US 2020/0044191 A1 Feb. 6, 2020

(30) Foreign Application Priority Data

Aug. 6, 2018 (JP) .................................. 2018-147657

(51) Int. Cl.
| | | |
|---|---|---|
| *H01L 27/00* | (2006.01) | |
| *H01L 51/00* | (2006.01) | |
| *H05K 1/18* | (2006.01) | |
| *H01L 51/52* | (2006.01) | |
| *H01L 27/32* | (2006.01) | |

(52) U.S. Cl.
CPC ...... *H01L 51/5253* (2013.01); *H01L 27/3248* (2013.01); *H01L 27/3276* (2013.01); *H01L 51/5203* (2013.01); *H05K 1/189* (2013.01); *H05K 2201/10106* (2013.01); *H05K 2201/10128* (2013.01)

(58) Field of Classification Search
CPC ............ H01L 27/3248; H01L 27/3276; H01L 27/1225; H01L 27/1266; H01L 27/3244; H01L 51/5253; H01L 51/5203; H01L 51/56; H01L 51/5246; H01L 51/10; H05K 1/189; H05K 2201/10106; H05K 2201/10128; H05K 1/0393; H05K 1/09; H05K 1/147
See application file for complete search history.

(56) References Cited

U.S. PATENT DOCUMENTS

| | | | | |
|---|---|---|---|---|
| 5,029,984 A | * | 7/1991 | Adachi | ............... G02F 1/13452 257/E25.011 |
| 5,293,262 A | * | 3/1994 | Adachi | ............... G02F 1/13452 257/E25.011 |
| 5,606,440 A | * | 2/1997 | Kawaguchi | ......... G02F 1/13452 349/188 |
| 8,039,753 B2 | * | 10/2011 | Jang | ....................... H05K 1/189 174/254 |

(Continued)

FOREIGN PATENT DOCUMENTS

| | | |
|---|---|---|
| JP | 2008-052248 | 3/2008 |
| WO | 2016/051681 | 4/2016 |

*Primary Examiner* — Nikolay K Yushin
(74) *Attorney, Agent, or Firm* — Greenblum & Bernstein, P.L.C.

(57) ABSTRACT

A display device includes: a panel unit that includes pixel drive circuits; and a panel terminal unit on an edge portion of the panel unit. The panel terminal unit includes: a board; wiring electrodes disposed on the board and connected to the pixel drive circuits; a mounted component mounted on the board and connected to the wiring electrodes; a protective film that is on the board and covers the wiring electrodes except for a mounting area where the mounted component is mounted on the board; and a resin portion that covers the mounted component and a portion of the protective film and not covers a rest of the protective film.

10 Claims, 14 Drawing Sheets

(56) References Cited

U.S. PATENT DOCUMENTS

| | | | |
|---|---|---|---|
| 8,947,866 B2* | 2/2015 | Jacobs | G02F 1/133308 |
| | | | 361/679.21 |
| 9,049,784 B2* | 6/2015 | Osako | H05B 33/02 |
| 9,263,510 B2* | 2/2016 | Takahara | H01L 27/3279 |
| 10,014,354 B2* | 7/2018 | Kondo | H01L 51/5271 |
| 2004/0114062 A1* | 6/2004 | Nishio | G02F 1/133308 |
| | | | 349/58 |
| 2008/0048948 A1 | 2/2008 | Koh et al. | |
| 2017/0069696 A1* | 3/2017 | Kondo | H01L 27/3276 |
| 2017/0077190 A1* | 3/2017 | Hashimoto | G09F 9/30 |
| 2017/0118848 A1* | 4/2017 | Matsui | G02F 1/133308 |
| 2017/0223824 A1 | 8/2017 | Ono | |

* cited by examiner

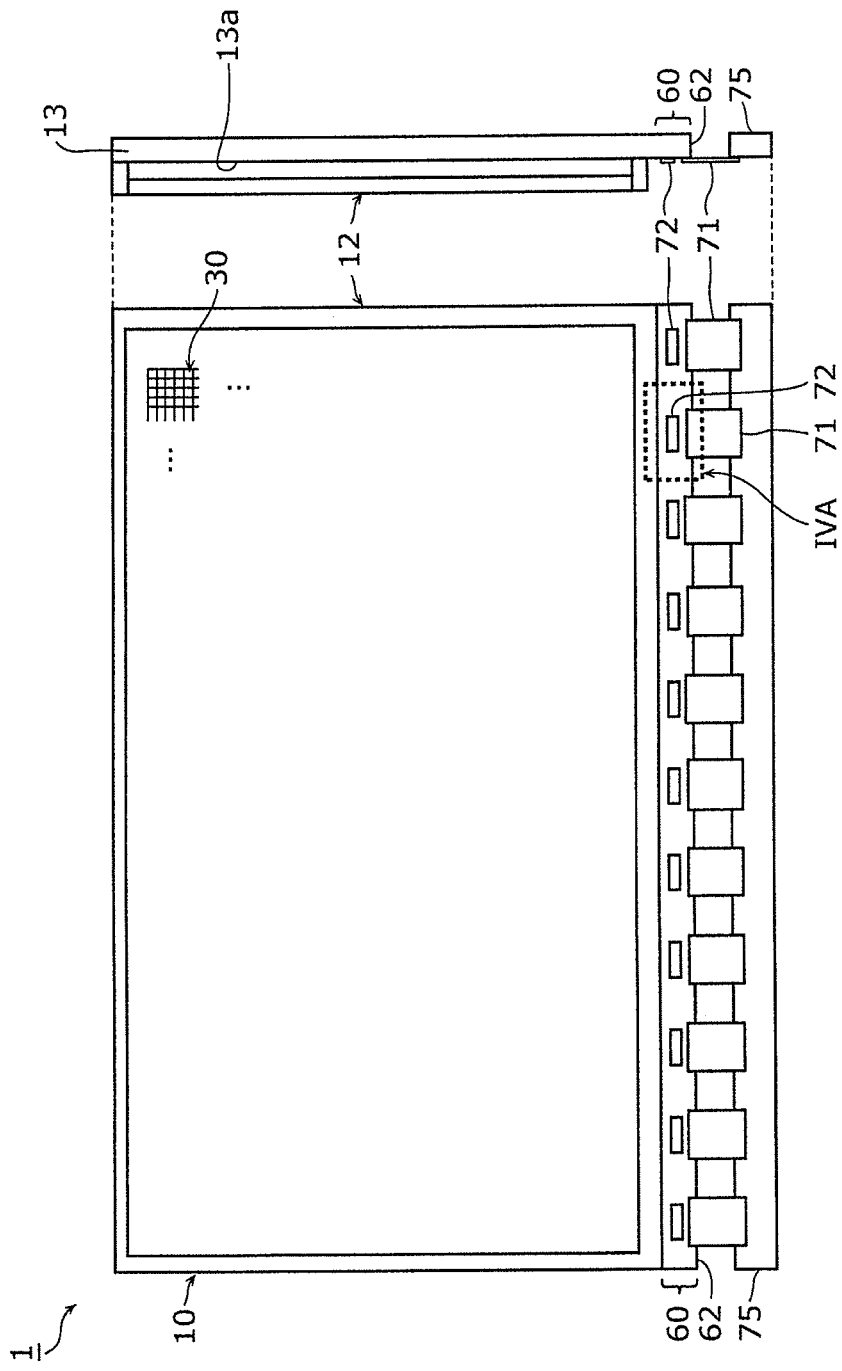

DISPLAY DEVICE

CROSS REFERENCE TO RELATED APPLICATION

The present application is based on and claims priority of Japanese Patent Application No. 2018-147657 filed on Aug. 6, 2018. The entire disclosure of the above-identified application, including the specification, drawings and claims is incorporated herein by reference in its entirety.

FIELD

The present disclosure relates to a display device for displaying an image.

BACKGROUND

Display devices for displaying an image have been known. As an example of the display devices, Japanese Unexamined Patent Application Publication No. 2008-52248 discloses a display device including a panel unit that includes a plurality of pixel drive circuits, wiring electrodes that are provided in an edge portion of the panel unit and connected to the plurality of pixel drive circuits, and a flexible printed wiring board that is connected to the wiring electrodes. In this display device, drive current for driving the plurality of pixel drive circuits is supplied from the flexible printed wiring board to the plurality of pixel drive circuits via the wiring electrodes.

SUMMARY

Technical Problem

For example, in the display device as described above, a protective film for protecting the wiring electrodes is provided on the wiring electrodes, and a resin portion is additionally formed in such a manner as to cover the entire surface of the protective film. On the display device, a damp heat test is conducted to evaluate its environment resistance and the like. In this damp heat test, the resin portion is repeatedly caused to swell and shrink, which applies an external force to the protective film. This can cause cracking to occur in the protective film or cause the protective film to be peeled off from the wiring electrodes. This can cause gas containing moisture and the like to penetrate between the protective film and the wiring electrodes, and the gas can corrode the wiring electrodes.

Hence, the present disclosure has an objective to inhibit wiring electrodes provided in an edge portion of a panel unit of a display device from being corroded.

Solution to Problem

In order to achieve the above-described object, in accordance with an aspect of the present disclosure, there is provided a display device including: a panel unit that includes a plurality of pixel drive circuits; and a panel terminal unit that is disposed on an edge portion of the panel unit, wherein the panel terminal unit includes: a board; a plurality of wiring electrodes that are disposed on the board and are connected to the plurality of pixel drive circuits; a mounted component that is mounted on the board and connected to the plurality of wiring electrodes; a protective film that is disposed on the board and covers the plurality of wiring electrodes except for a mounting area where the mounted component is mounted on the board; and a resin portion that covers the mounted component and a portion of the protective film and not covers a rest of the protective film.

In accordance with another aspect of the present disclosure, there is provided a display device including: a panel unit that includes a plurality of pixel drive circuits; and a panel terminal unit that is disposed on an edge portion of the panel unit, wherein the panel terminal unit includes: a board; a plurality of wiring electrodes that are disposed on the board and are connected to the plurality of pixel drive circuits; a mounted component that is mounted on the board and connected to the plurality of wiring electrodes; a protective film that is disposed on the board covers the plurality of wiring electrodes except for a mounting area where the mounted component is mounted on the board; and a resin portion that covers the mounted component and a portion or an entirety of the protective film, wherein the resin portion includes a first resin portion that is located on a portion of the protective film located in a surrounding area of the mounted component and a second resin portion that is located on another portion of the protective film located in an area different from both the mounting area and the surrounding area, and a height of the second resin portion is less than a height of the first resin portion with respect to the protective film.

Advantageous Effects

In the display device according to an embodiment of the present disclosure, corrosion of wiring electrodes provided in an edge portion of a panel unit can be inhibited.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 3 includes a plan view and a side view illustrating the display device according to Embodiment 1.

DESCRIPTION OF EMBODIMENTS

Figure 1:
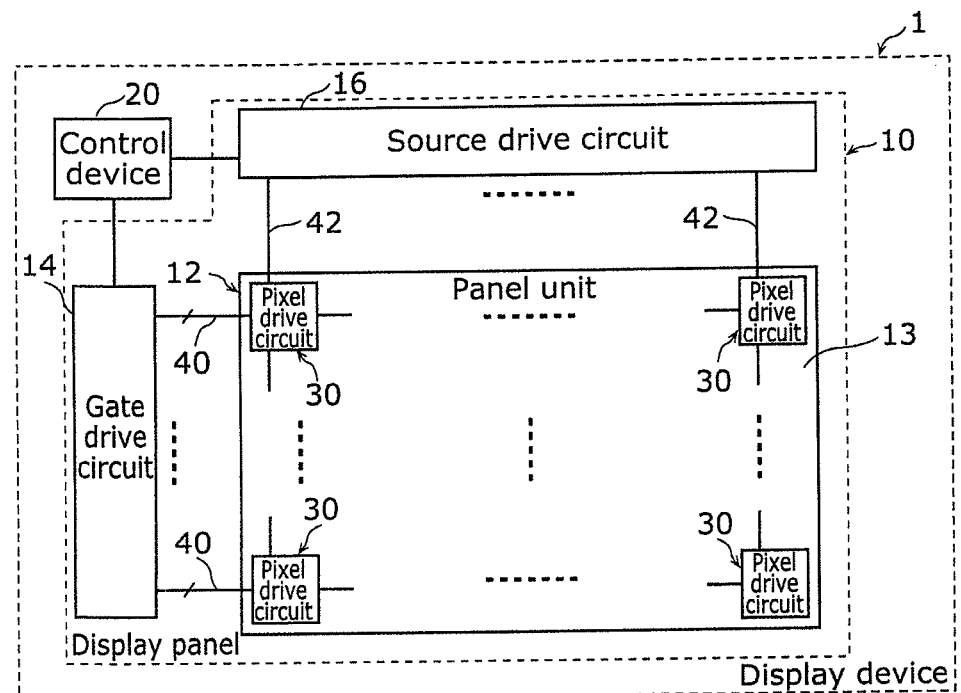
FIG. 1 is a schematic diagram illustrating the display device according to Embodiment 1.

Hereinafter, embodiments according to the present disclosure are described. It should be noted that all the embodiments described below are generic and specific examples of the present disclosure. Numerical values, shapes, materials, constituent elements, arrangement positions and the connection configuration of the constituent elements, steps, the order of the steps, and the like described in the following embodiments are merely examples, and are not intended to limit the present disclosure. The present disclosure is characterized by the appended claims. Therefore, among the constituent elements in the following embodiments, constituent elements that are not described in independent claims that show the most generic concept of the present disclosure are described as elements constituting more desirable configurations.

It should also be noted that each figure in the Drawings is a schematic diagram and is not necessarily an exact diagram. In each figure, substantially identical constituent elements are assigned with a same reference sign, and explanation of such substantially identical constituent elements is sometimes not repeated or simplified.

Embodiment 1

Embodiment 1 will be described below in detail with reference to FIG. 1 to FIG. 4D. In the present embodiment, a display device 1 that includes organic electroluminescence devices will be described as an example of the display device.

[1-1. General Configuration of Display Device]

First, a general configuration of the display device 1 will be described.

Figure 2:
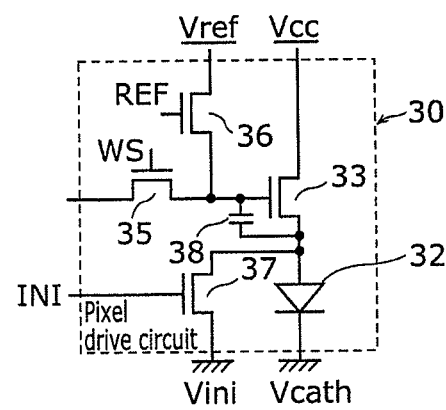
FIG. 2 is a circuit diagram illustrating a pixel drive circuit of the display device according to Embodiment 1.

FIG. 1 is a schematic diagram illustrating the display device 1 according to Embodiment 1. FIG. 2 is a circuit diagram illustrating a pixel drive circuit 30 of the display device 1.

As illustrated in FIG. 1, the display device 1 includes a display panel 10 and a control device 20.

The control device 20 is formed on an external system circuit board (not illustrated), which is disposed outside the display panel 10. The control device 20 has a function of, for example, a timing controller (TCON) and is configured to control workings of the display device 1 as a whole. Specifically, the control device 20 instructs a gate drive circuit 14 according to a vertical synchronizing signal, a horizontal synchronizing signal, and a video period signal that are supplied from the outside. In addition, the control device 20 is configured to supply digital serial data items on video signals R, G, and B to a source drive circuit 16.

The display panel 10 includes a panel unit 12, the gate drive circuit 14, and the source drive circuit 16.

The panel unit 12 is, for example, an organic EL display panel and has a rectangular shape. The panel unit 12 includes a panel board 13, a plurality of pixel drive circuits 30 that are arranged on the panel board 13 in a matrix pattern, and a plurality of scanning lines 40 and a plurality of signal lines 42, both of which are provided on the panel board 13. More in detail, the panel unit 12 includes the plurality of scanning lines 40 that are arranged in a row direction, the plurality of signal lines 42 that are arranged in a column direction, and pixel drive circuits 30 that are arranged at intersections between the scanning lines 40 and the signal lines 42, the pixel drive circuits 30 each having a light emitting device 32.

The panel board 13 is made of, for example, a glass material or a resin material such as acrylic.

The plurality of pixel drive circuits 30 are formed on the panel board 13 through, for example, a semiconductor process. The pixel drive circuits 30 each have an organic light-emitting device as its light emitting device, forming a light emitting pixel of one of three primary colors RGB. As illustrated in FIG. 2, the pixel drive circuits 30 each include the light emitting device 32, a drive transistor 33, a selection transistor 35, switch transistors 36 and 37, and a pixel capacitor 38. A configuration of the pixel drive circuit 30 will be described later.

One end of each of the scanning lines 40 is connected to an output end of each stage of the gate drive circuit 14, and the other end is connected to pixel drive circuits 30. One end of each of the signal lines 42 is connected to an output end of each stage of the source drive circuit 16, and the other end is connected to pixel drive circuits 30.

The gate drive circuit 14 is a drive circuit configured to scan a gate drive signals on a row-by-row basis of the pixel drive circuits 30. The gate driving signal is a signal that is input into gates of a drive transistor 33, a selection transistor 35, and switch transistors 36 and 37 in a pixel drive circuit 30 to turn on or off the transistors.

The gate drive circuit 14 is made up of, for example, shift registers. Given a video period signal from the control device 20, the gate drive circuit 14 outputs the gate drive signal in synchronization with a vertical synchronizing signal, which is also given from the control device 20, driving the scanning lines 40. The pixel drive circuits 30 are thereby sequentially selected per frame, and the light emitting devices 32 of the pixel drive circuits 30 emit light at luminances commensurate with the video signals. The gate drive circuit 14 may be disposed on one of short sides of the panel unit 12 as illustrated in FIG. 1, but the disposition is not limited to this one; gate drive circuits 14 may be disposed on two facing short sides of the panel unit 12.

The source drive circuit 16 is a drive circuit configured to supply video signals that are supplied from the control device 20 for each frame, to the pixel drive circuits 30.

The source drive circuit 16 is a current-driven or voltage-driven drive circuit configured to write luminance information based on the video signals onto the pixel drive circuits 30 in a form of a current value or a voltage value, through the signal lines 42. The source drive circuit 16 according to the present embodiment is, for example, the voltage-driven drive circuit. Based on the video signals input from the control device 20, the source drive circuit 16 supplies voltages indicating brightnesses of the light emitting devices 32 provided in the pixel drive circuits 30, to the signal lines 42.

The video signals input from the control device 20 to the source drive circuit 16 are, for example, digital serial data items corresponding to the three primary colors R, G, and B (video signals R, G, and B). The video signals R, G, and B input into the source drive circuit 16 are converted in the source drive circuit 16 into row-based parallel data. In addition, the row-based parallel data is converted in the source drive circuit 16 into row-based analog data, which is then output to the signal lines 42. Voltages output to the signal lines 42 are written onto pixel capacitors 38 of pixel drive circuits 30 that belong rows selected in scanning by the gate drive circuit 14. That is, electric charges corresponding to the voltages output to the signal lines 42 are accumulated in the pixel capacitors 38. The source drive circuit 16 may be disposed on one long side of the panel unit 12 as illustrated in FIG. 1, but the disposition is not limited to this one; source drive circuits 16 may be disposed on two facing long sides of the panel unit 12.

[1-2. Configuration of Pixel Drive Circuit]

Next, a configuration of a pixel drive circuit 30 will be described. As illustrated in FIG. 2, the pixel drive circuit 30 includes a light emitting device 32, a drive transistor 33, a selection transistor 35, switch transistors 36 and 37, and a pixel capacitor 38.

The light emitting device 32 is, for example, an organic light-emitting diode device, which includes an anode and a cathode. Note that the light emitting device 32 is not limited to the organic light-emitting device and may be another kind of light-emitting device. Examples of the light emitting device 32 generally include all kinds of devices that are driven by current to emit light.

The switch transistor 37 is brought to an on state in response to a control signal INI that is supplied from a scanning line 40, setting a source of the drive transistor 33 at a reference voltage Vini. The switch transistor 36 is brought to an on state in response to a control signal REF that is supplied from a scanning line 40, setting a gate of the drive transistor 33 at a reference voltage Vref. The selection transistor 35 is brought to an on state in response to a control signal WS that is supplied from a scanning line 40, storing an electric charge commensurate with an electric potential of a video signal supplied from a signal line 42, in the pixel capacitor 38. Based on the electric potential of the signal caused by the stored electric charge, the pixel capacitor 38 applies a voltage to the gate of the drive transistor 33.

By being brought to the on state, the drive transistor 33 supplies a drain-source current commensurate with a gate-source voltage to the light emitting device 32. With the drain-source current, the light emitting device 32 emits light commensurate with the electric potential of the video signal.

The drive transistor 33, the selection transistor 35, the switch transistors 36, and the switch transistor 37 are each formed of, for example, an N-channel polysilicon thin film transistor (TFT). Note that the conductivity types of the transistors are not limited to conductivity types described above, and N-channel TFTs and P-channel TFTs may be used in combination as appropriate. The transistors are not limited to the polysilicon TFTs and may be formed of amorphous silicon TFTs or the like.

[1-3. Configuration of Panel Unit]

Next, a configuration of the panel unit will be described with reference to FIG. 3.

FIG. 3 includes a plan view and a side view illustrating the display device 1. In the present embodiment, the plan view refers to a diagram of the display device 1 seen from its front in actual use.

As illustrated in FIG. 3, the display device 1 includes a panel unit 12 and a driver circuit board 75.

The panel unit 12 includes a panel board 13 having a rectangular shape, a plurality of pixel drive circuits 30 that are arranged on a main face 13*a* of the panel board 13 in a matrix pattern, and scanning lines 40 and signal lines 42, both of which are connected to the plurality of pixel drive circuits 30. Inside the panel unit 12, for example, the gate drive circuit 14 is embedded close to one short side of the panel unit 12 (not illustrated). On one long side of the panel unit 12, a panel terminal unit 60 is provided on an edge portion of the panel unit 12. The panel terminal unit 60 is a unit used for connecting the panel unit 12 electrically to an external circuit board or the like.

The driver circuit board 75 is disposed close to the one long side of the panel unit 12. On the driver circuit board 75, for example, a part of the source drive circuit 16 is mounted. The driver circuit board 75 is connected to the panel terminal unit 60 via a plurality of flexible printed wiring boards. The control device 20 may be mounted on the driver circuit board 75 or may be connected to the driver circuit board 75 via a distribution cable (not illustrated).

Next, a configuration of the panel terminal unit 60 will be described with reference to FIG. 4A to FIG. 4D.

Figure 4A:
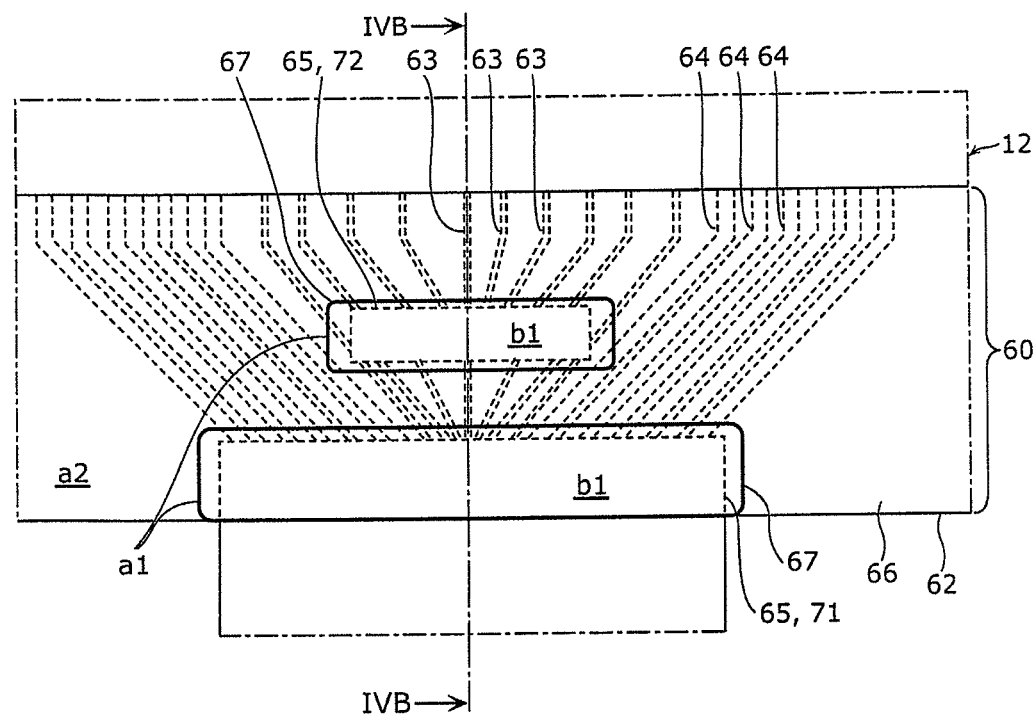
FIG. 4A is a plan view of a part of a panel terminal unit of a display device according to Embodiment 1, serving as a detail view of an IVA portion illustrated in FIG. 3.
Figure 4B:
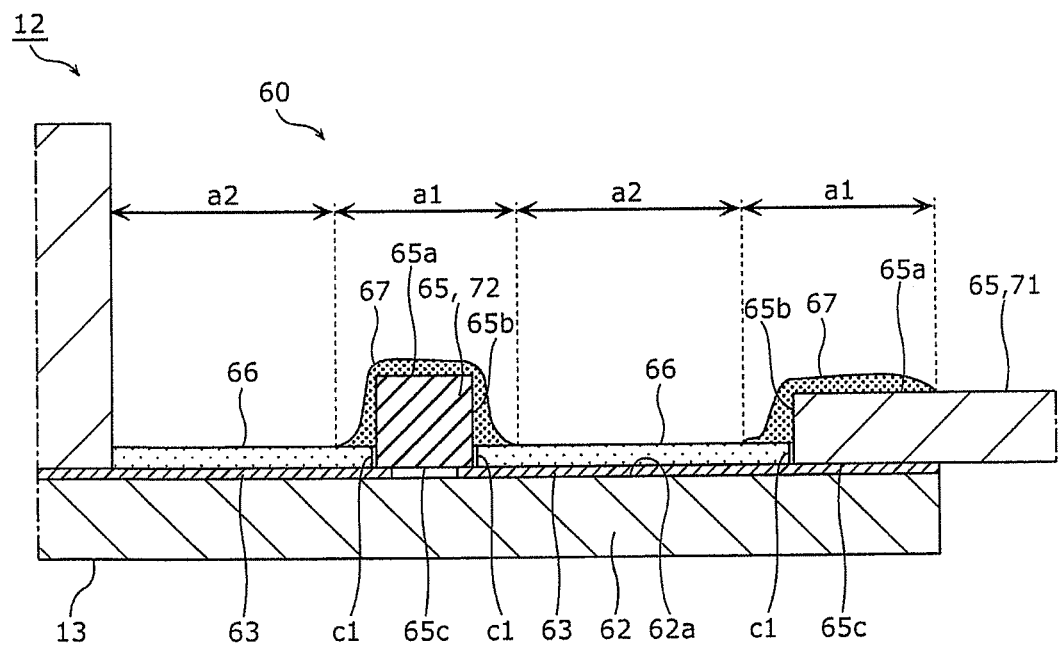
FIG. 4B is a cross-sectional view of the panel terminal unit according to Embodiment 1 taken along IVB-IVB line of FIG. 4A.
Figure 4C:
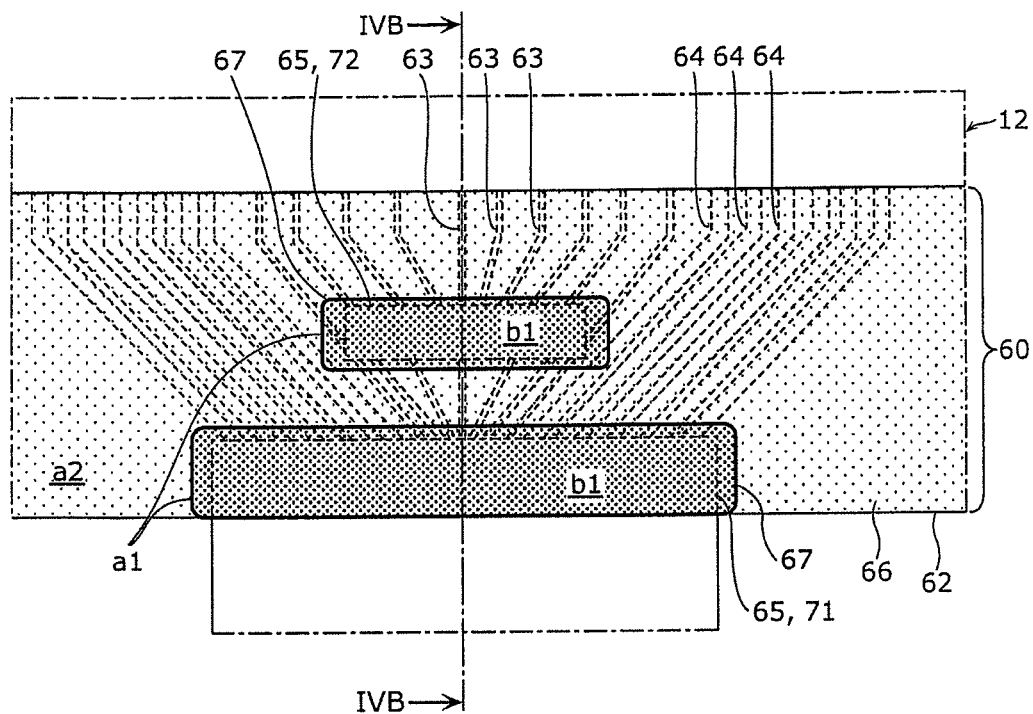
FIG. 4C is a diagram illustrating resin-covered portions and a protective-film exposed portion of the panel terminal unit illustrated in FIG. 4A.
Figure 4D:
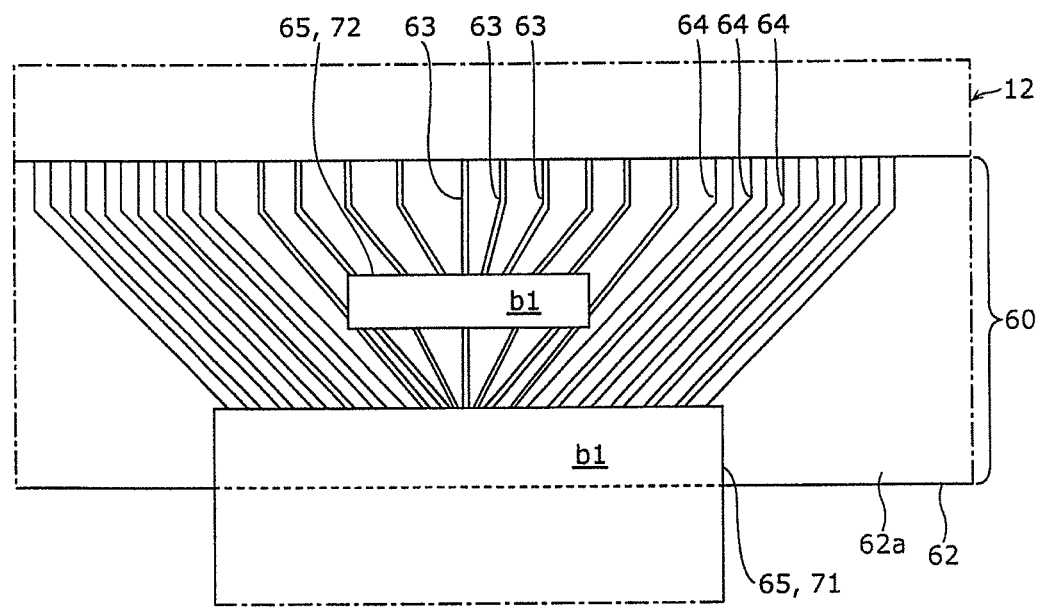
FIG. 4D is a diagram of a configuration of the panel terminal unit illustrated in FIG. 4A from which a protective film and a resin portion are removed.

FIG. 4A is a plan view of a part of the panel terminal unit 60 of the display device 1, serving as a detail view of an IVA portion illustrated in FIG. 3. FIG. 4B is a cross-sectional view of the panel terminal unit 60 taken along IVB-IVB line of FIG. 4A. FIG. 4C is a diagram illustrating resin-covered portions a1 and a protective-film exposed portion a2 of the panel terminal unit 60 illustrated in FIG. 4A. FIG. 4D is a diagram of a configuration of the panel terminal unit 60 illustrated in FIG. 4A from which a protective film 66 and a resin portion 67 are removed.

Next, the part of the panel terminal unit 60 illustrated in FIG. 4A to FIG. 4D will be described by way of example. In FIG. 4A to FIG. 4D, illustration of the power source lines connected to the pixel drive circuits 30 is omitted. FIG. 4D is a reference drawing to help understanding of a structure of the panel terminal unit 60.

As illustrated in FIG. 4A and FIG. 4B, the panel terminal unit 60 includes a board 62, a plurality of wiring electrodes 63 and 64, mounted components 65, the protective film 66, and the resin portions 67.

The board 62 is formed as a portion of the panel board 13 described above and located in an edge portion of the panel board 13 on one long side of the panel board 13. The board 62 is made of the same material as that of the panel board 13.

The plurality of wiring electrodes 63 and 64 are provided on the board 62 with small pitches (see FIG. 4D). The plurality of wiring electrodes 63 and 64 are connected selectively to the plurality of pixel drive circuits 30. Specifically, the wiring electrodes 63 are connected to the plurality of pixel drive circuits 30 via the signal lines 42. On the wiring electrodes 63, a driver integrated circuit (IC) 72, described later, is mounted. The wiring electrodes 64 are connected to the plurality of pixel drive circuits 30 via the gate drive circuit 14 and the scanning lines 40. The wiring electrodes 63 and 64 are made of, for example, a material containing copper or aluminum.

As illustrated in FIG. 4B, on a side of the board 62 close to its main face 62a, the flexible printed wiring board 71 and the driver IC 72 are mounted. As described above, the flexible printed wiring board 71 connects the board 62 and the driver circuit board 75. The driver IC 72 is, for example, a source driver that constitutes a part of the source drive circuit 16. Signals output from the driver IC 72 are input into the pixel drive circuits 30 via the wiring electrodes 63 and the signal lines 42.

The flexible printed wiring board 71 is an example of the mounted components 65 mounted on the panel terminal unit 60, and the driver IC 72 is an example of the mounted components 65 mounted on the panel terminal unit 60. Hereinafter, a mounted component 65 refers to one or both of the flexible printed wiring board 71 and the driver IC 72.

The mounted component 65 includes a top face 65a, side faces 65b, and a bottom face 65c. The mounted component 65 is mounted on the board 62 in such a manner that its external terminal provided on the bottom face 65c is connected to a plurality of wiring electrodes 63 and 64. The mounted component 65 is joined to the wiring electrodes 63 and 64 with, for example, a conductive adhesive.

The protective film 66 is a film for protecting the wiring electrodes 63 and 64 from the outside air. The protective film 66 is, for example, a silicon nitride film and formed by the chemical vapor deposition (CVD). The protective film 66 is provided on the board 62 in such a manner as to cover the plurality of wiring electrodes 63 and 64 except for areas b1 (hereinafter, referred to as mounting areas b1) where the mounted component 65 is mounted on the board 62. Specifically, the protective film 66 is formed on the area of the board 62 except for the mounting areas b1 using a mask when the protective film 66 is formed by the CVD.

After the protective film 66 formed on a part of the board 62, the mounted components 65 are mounted in the mounting areas b1. Mounting the mounted components 65 involves occurrence of unevenness in mounting accuracy; therefore, a layout of the protective film 66 and the mounted components 65 is designed such that the protective film 66 and the mounted components 65 do not interfere with each other even when the unevenness occurs. Accordingly, there are gaps c1 formed between the protective film 66 and the mounted components 65 after being mounted.

The resin portions 67 are charged between the protective film 66 and the mounted components 65 so as to close these gaps c1. Specifically, the resin portions 67 are formed so as to cover the top face 65a and the side faces 65b of each of the mounted components 65 and the above gaps c1 and to cover portions of the protective film 66 located in surrounding areas of the mounted components 65. That is, the resin portions 67 are provided in such a manner as to cover the mounted components 65 and cover portions of the protective film 66 and not to cover the rest of the protective film 66. For example, when the panel terminal unit 60 is seen in a direction perpendicular to the main face 62a of the board 62, the area of the resin portions 67 is 1.1 times or larger and 3 times or smaller the area of the mounting areas b1.

The resin portions 67 are each made of a resin material having an electrical insulation property, such as epoxy material and silicon material. The resin portions 67 are formed by, for example, an inkjet apparatus such as a 3D printer. The resin portions 67 may be formed by a dispenser (constant-volume liquid discharging device) or a screen printer.

As illustrated in FIG. 4C, presence and absence of the resin portions 67 on the protective film 66 make the protective film 66 include resin-covered portions a1, where the protective film 66 is covered with the resin portions 67, and a protective-film exposed portion a2, where the protective film 66 is not covered with the resin portions 67 but exposed. The protective-film exposed portion a2 is provided on at least some of the wiring electrodes 63 and 64. In the present embodiment, the protective-film exposed portion a2 is provided on all of the wiring electrodes 63 and 64. In addition, the protective-film exposed portion a2 are provided on the wiring electrodes 63 and 64 except for the mounting areas b1 and surrounding areas of the mounting areas b1 in a direction in which the wiring electrodes 63 and 64 extend.

In the display device 1 in the present embodiment, the resin portions 67 cover only the mounted components 65 and the surrounding areas of the mounted components 65, which can reduce the areas of contacts between the protective film 66 and the resin portions 67. This enables a reduction in areas that can suffer cracking or peeling in the protective film 66. This can inhibit the outside air containing moisture and the like from penetrating between the protective film 66 and the wiring electrodes 63 and 64, which can inhibit corrosion of the wiring electrodes 63 and 64.

[1-4. Advantageous Effects]

Here, to describe advantageous effects of the display device 1 in the present embodiment, a display device in a comparative example will be described.

Figure 5A:
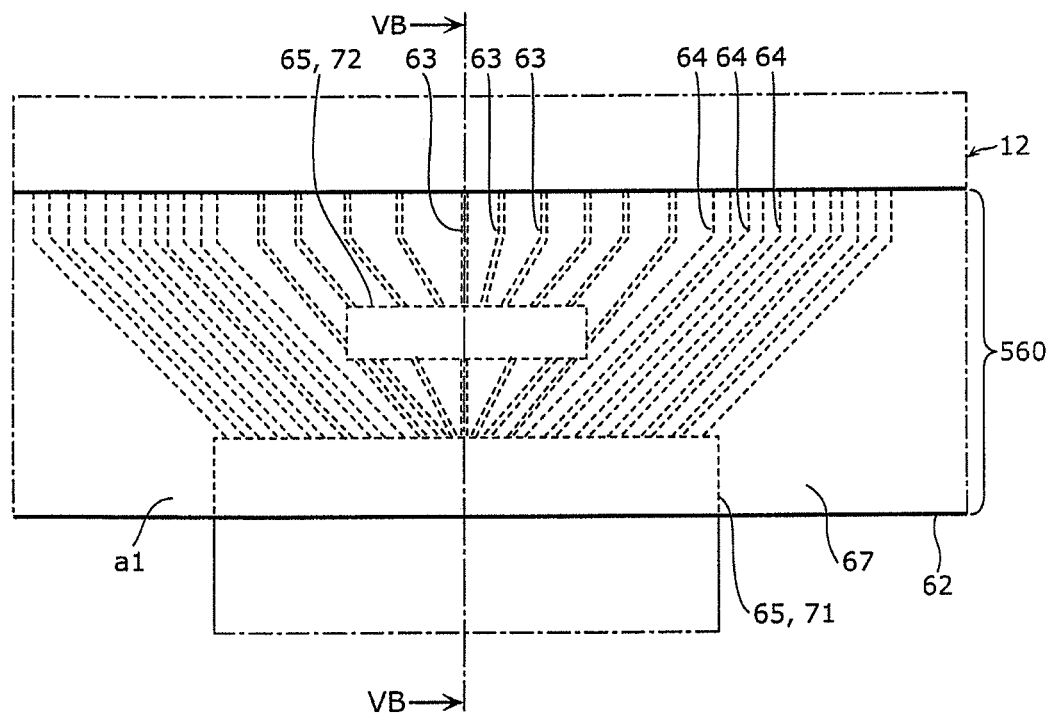
FIG. 5A is a plan view of a part of a panel terminal unit of a display device according to a comparative example.
Figure 5B:
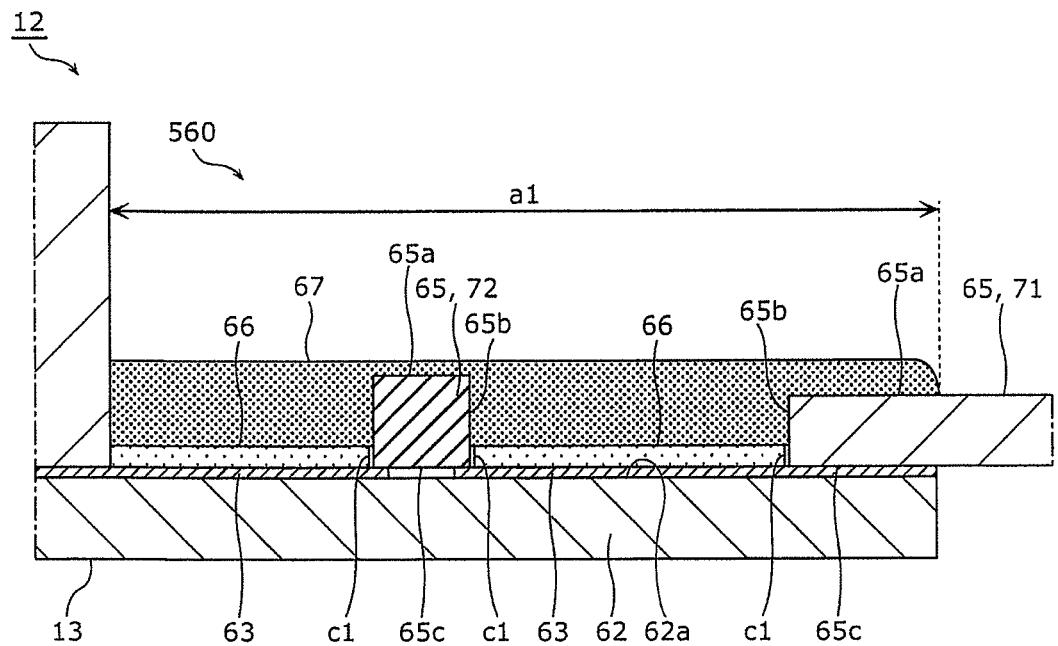
FIG. 5B is a cross-sectional view of the panel terminal unit according to the comparative example taken along VB-VB line of FIG. 5A.

FIG. 5A is a plan view of a part of a panel terminal unit 560 of the display device according to the comparative example. FIG. 5B is a cross-sectional view of the panel terminal unit 560 of the display device according to the comparative example taken along VB-VB line of FIG. 5A.

As illustrated in FIG. 5A and FIG. 5B, the panel terminal unit 560 of the display device in the comparative example includes a board 62, a plurality of wiring electrodes 63 and 64, mounted components 65, a protective film 66, and a resin portion 67. The resin portion 67 is provided in such a manner as to cover the mounted components 65 and the entire protective film 66, that is, the entire surface of the panel terminal unit 560. As a result, in a case where the display device in the comparative example is placed under a high-temperature high-humidity environment, the resin portion 67 alternates shrinking and swelling, applying an external force to the protective film 66. This will cause cracking to occur in the protective film 66 or cause the protective film 66 to be peeled off from the wiring electrodes 63 and 64. This tends to arise a problem in which the outside air containing moisture and the like penetrates between the protective film 66 and the wiring electrodes 63 and 64, which can cause corrosion of the wiring electrodes 63 and 64.

On the other hand, the display device 1 in the present embodiment includes: the panel unit 12 that includes a plurality of pixel drive circuits 30; and the panel terminal unit 60 that is disposed on an edge portion of the panel unit 12. Here, the panel terminal unit 60 includes: the board 62; the plurality of wiring electrodes 63, 64 that are disposed on the board 62 and are connected to the plurality of pixel drive circuits 30; the mounted component 65 that is mounted on the board 62 and connected to the plurality of wiring electrodes 63, 64; the protective film 66 that is disposed on the board 62 and covers the plurality of wiring electrodes 63, 64 except for a mounting area b1 where the mounted component 65 is mounted on the board 62; and the resin portion 67 that covers the mounted component 65 and a portion of the protective film 66 and not covers a rest of the protective film 66.

By providing the resin portions 67 in this manner so that the resin portions 67 cover portions of the protective film 66 and do not cover the rest of the protective film 66, the areas where the protective film 66 and the resin portions 67 are in contact with each other can be reduced as compared with, for example, a structure in which a resin portion covers the entire protective film (the comparative example). This enables a reduction in areas that can suffer cracking or peeling in the protective film 66. This can inhibit the outside air containing moisture and the like from penetrating between the protective film 66 and the wiring electrodes 63 and 64, which can inhibit corrosion of the wiring electrodes 63 and 64.

It is also possible that the protective film 66 includes a resin-covered portion a1 covered with the resin portion 67 and a protective film exposed portion a2 not covered with the resin portion 67.

By making the protective film 66 have the protective-film exposed portion a2 in this manner, the protective film 66 can be provided with an area where the protective film 66 is not in contact with the resin portions 67. This can provide the protective film 66 with an area that resists suffering cracking or peeling. This can inhibit the outside air from penetrating between the protective film 66 and the wiring electrodes 63 and 64 in the area where the protective-film exposed portion a2 is provided, which in turn inhibit corrosion of the wiring electrodes 63 and 64.

It is further possible that the protective film exposed portion a2 is disposed on at least a part of the plurality of wiring electrodes 63, 64.

This enables a structure in which at least a portion of the protective film 66 located on the wiring electrodes 63 and 64 is not covered with a resin portion 67. This can inhibit the occurrence of cracking or peeling in the protective film 66 on the wiring electrode 63 and 64. As a result, it becomes difficult for the outside air to penetrate between the protective film 66 and the wiring electrodes 63 and 64, which can inhibit the corrosion of the wiring electrodes 63 and 64.

It is still further possible that an area of the resin portion 67 is 1.1 times or larger and 3 times or smaller an area of the mounting area b1.

This allows the resin portions 67 to substantially cover only the mounted components 65 and the surrounding areas of the mounted components 65, which can reduce the areas where the protective film 66 and resin portions 67 are in contact with each other. This enables a reduction in areas that can suffer cracking or peeling in the protective film 66. This can inhibit the outside air from penetrating between the protective film 66 and the wiring electrodes 63 and 64, which can inhibit corrosion of the wiring electrodes 63 and 64.

Furthermore, the protective film 66 and the mounted component 65 have a gap c1, and the resin portion 67 closes the gap c1.

This can inhibit the outside air from penetrating into the gaps c1, which can inhibit corrosion of the wiring electrodes 63 and 64. It is also possible that the mounted component 65 is at least one of a flexible printed wiring board 71 and a driver integrated circuit (IC) 72.

Using the panel terminal unit 60 that can inhibit the corrosion of the wiring electrodes 63 and 64 as described above enables a reliable electrical connection between the wiring electrodes 63 and 64 and the flexible printed wiring board 71 or the driver IC 72. This can inhibit a quality of the display device 1 from deteriorating.

It is further possible that the display device 1 further includes: a driver circuit board 75 that supplies a drive current for driving the plurality of pixel drive circuits 30. Here, the mounted component 65 is a flexible printed wiring board 71, and the panel terminal unit 60 is connected to the driver circuit board 75 via the flexible printed wiring board 71.

Using the panel terminal unit 60 that can inhibit the corrosion of the wiring electrodes 63 and 64 as described above enables a reliable electrical connection between the wiring electrodes 63 and 64 and the driver circuit board 75 via the flexible printed wiring board 71. This can inhibit a quality of the display device 1 from deteriorating.

[1-5. Modification]

Next, a display device 1A according to a modification of Embodiment 1 will be described with reference to FIG. 6 to FIG. 7C. In the present modification, a panel terminal unit 60A does not include the driver IC 72 but only includes the flexible printed wiring board 71.

Figure 6:
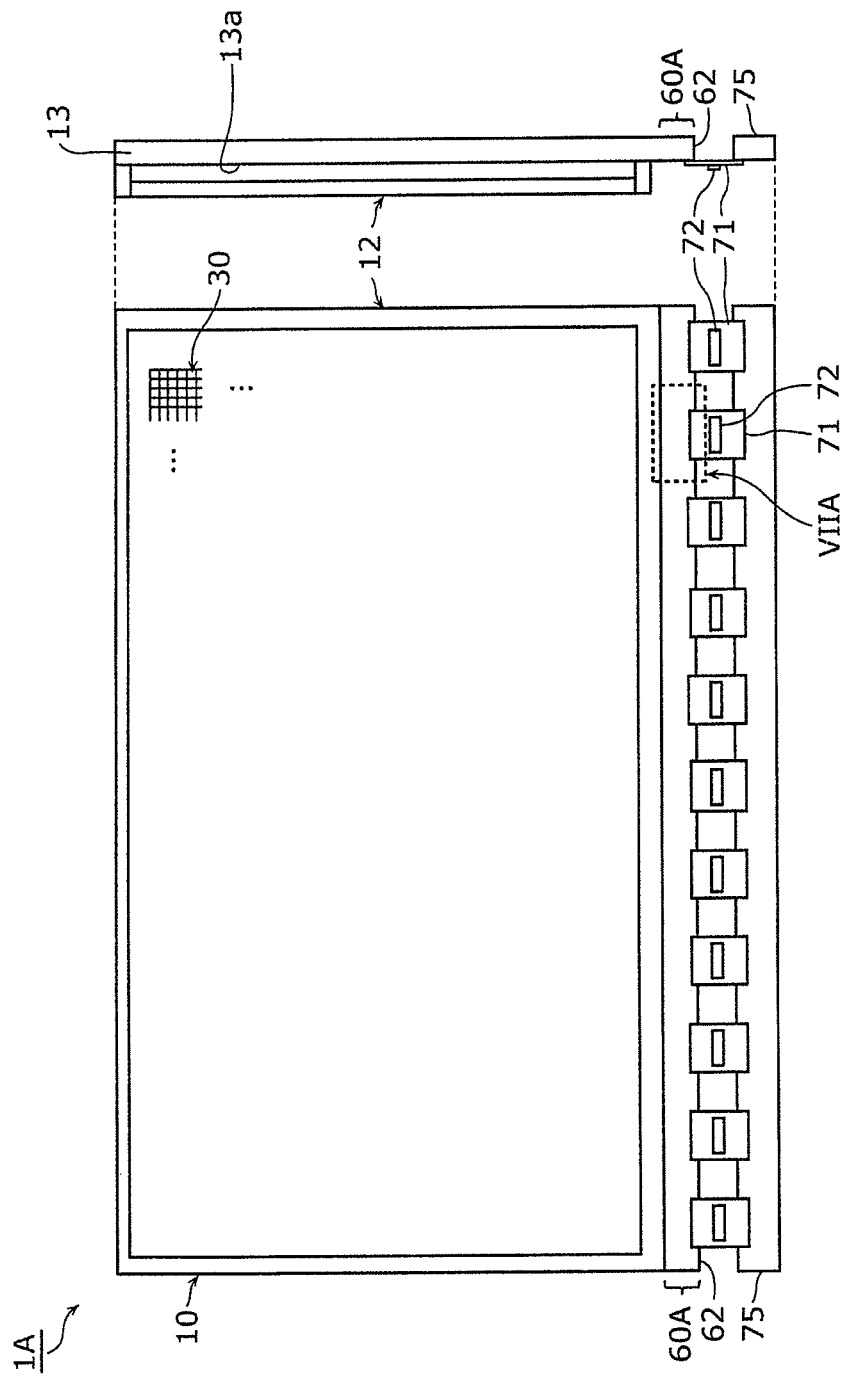
FIG. 6 is a plan view illustrating a display device according to a modification of Embodiment 1.
Figure 7A:
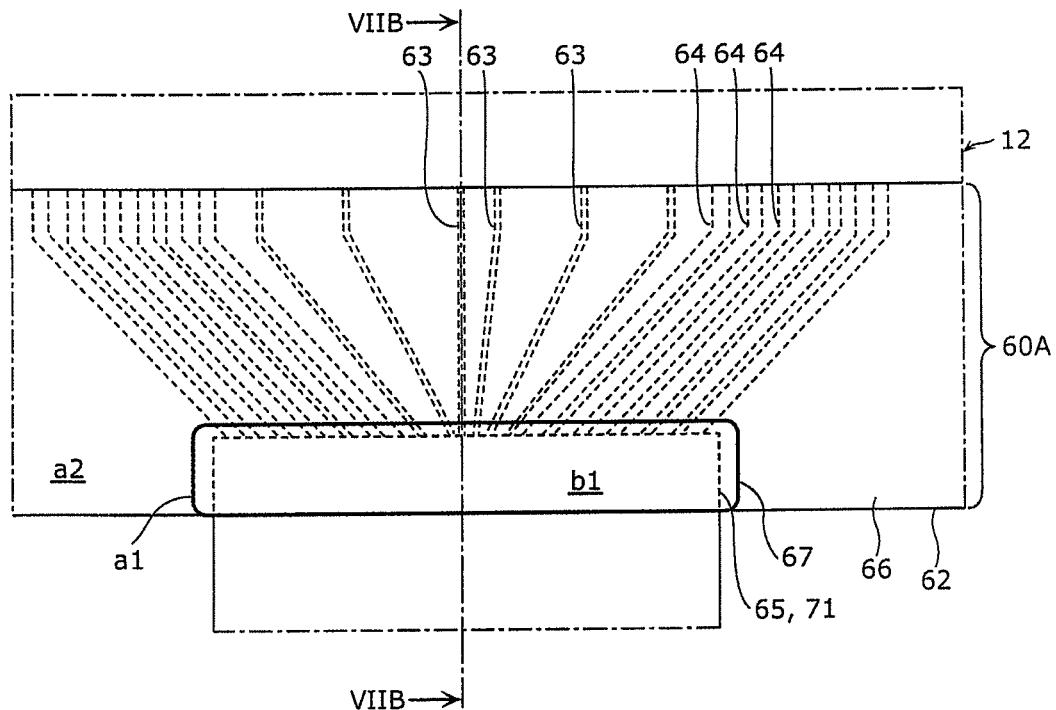
FIG. 7A is a plan view of a part of a panel terminal unit of a display device according to a modification of Embodiment 1, serving as a detail view of a VIIA portion illustrated in FIG. 6.
Figure 7B:
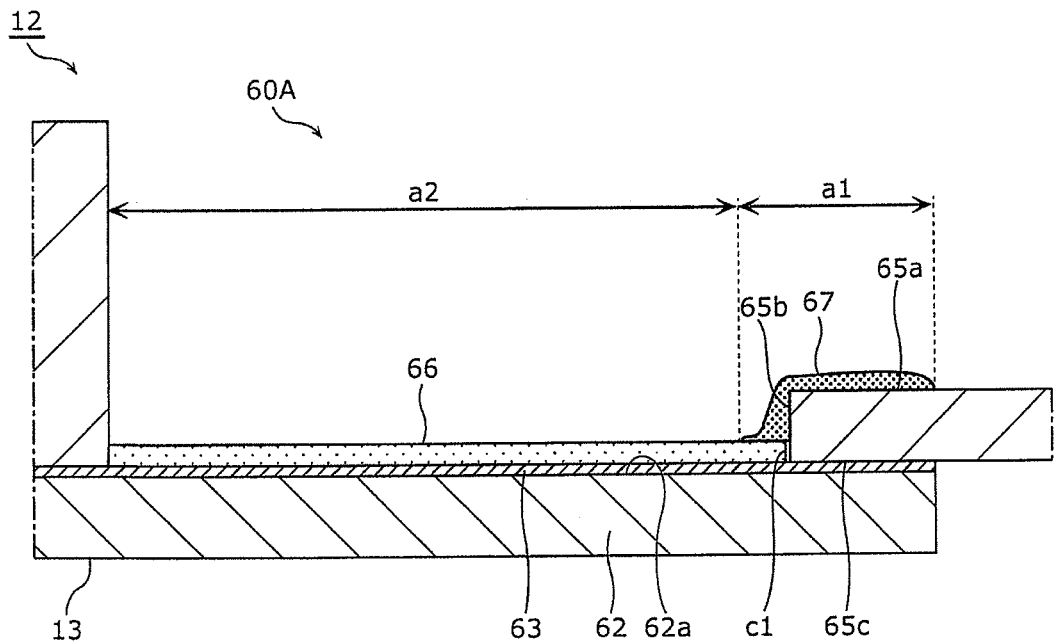
FIG. 7B is a cross-sectional view of the panel terminal unit according to the modification of Embodiment 1 taken along VIIB-VIIB line of FIG. 7A.

FIG. 6 is a plan view illustrating the display device 1A according to the modification. FIG. 7A is a plan view of a part of the panel terminal unit 60A of the display device 1A, serving as a detail view of a VIIA portion illustrated in FIG. 6. FIG. 7B is a cross-sectional view of the panel terminal unit 60A taken along VIIB-VIIB line of FIG. 7A.

Figure 7C:
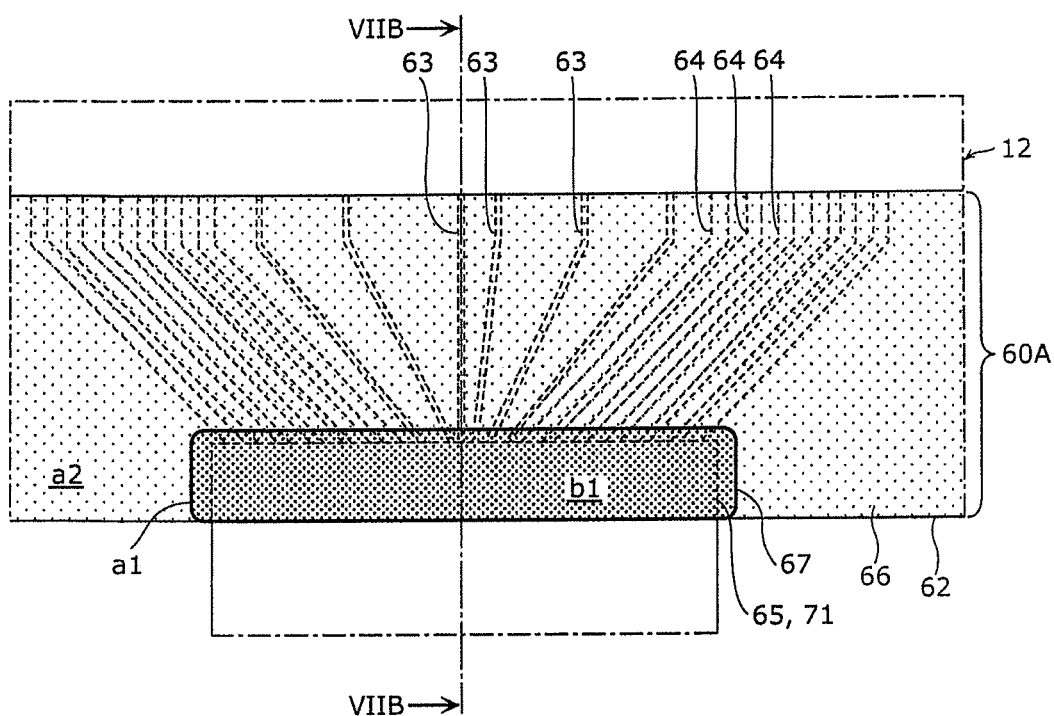
FIG. 7C is a diagram illustrating a resin-covered portion and a protective-film exposed portion of the panel terminal unit illustrated in FIG. 7A.

As illustrated in FIG. 6 to FIG. 7C, on the board 62, the driver IC 72 is not mounted, but only the flexible printed wiring board 71 is mounted. That is, the panel terminal unit 60A includes only the flexible printed wiring board 71 as a mounted component 65. The driver IC 72 is packaged in the flexible printed wiring board 71. This driver IC 72 is connected to the plurality of pixel drive circuits 30 via wiring of the flexible printed wiring board 71, the wiring electrodes 63 of the panel terminal unit 60A, and the signal lines 42.

Even in a case where, as in this modification, only the flexible printed wiring board 71 is mounted on the panel terminal unit 60A, by providing a resin portion 67 so that the resin portion 67 covers a portion of the protective film 66 and do not cover the rest of the protective film 66, an area where the protective film 66 and the resin portion 67 are in contact with each other can be reduced as compared with the comparative example. This enables a reduction in areas that can suffer cracking or peeling in the protective film 66. This can inhibit the outside air from penetrating between the protective film 66 and the wiring electrodes 63 and 64, which can inhibit corrosion of the wiring electrodes 63 and 64.

Embodiment 2

Next, a display device according to Embodiment 2 will be described with reference to FIG. 8A and FIG. 8B. In Embodiment 2, an example in which the protective film 66 is not provided with a resin portion 67 in portions on predetermined neighboring wiring electrodes will be described.

Figure 8A:
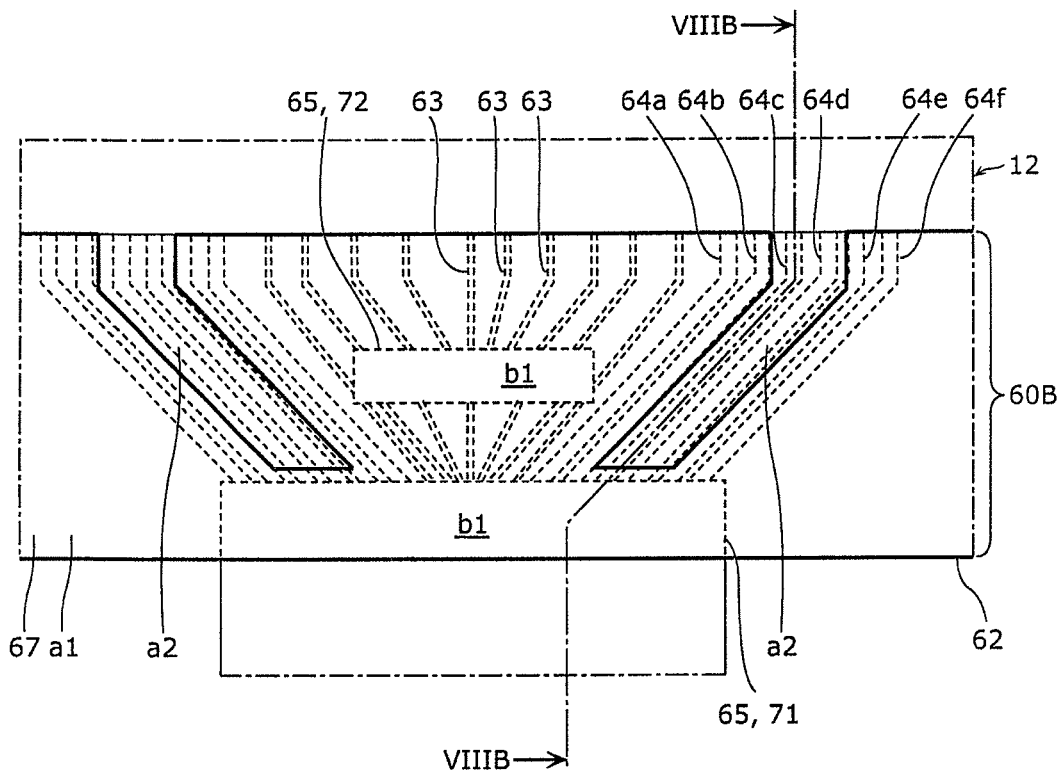
FIG. 8A is a plan view of a part of a panel terminal unit of a display device according to Embodiment 2.

FIG. 8A is a plan view of a part of a panel terminal unit 60B of the display device according to Embodiment 2. FIG. 8B is a cross-sectional view of the panel terminal unit 60B taken along VIIIB-VIIIB line of FIG. 8A. FIG. 8C is a diagram illustrating a resin-covered portion a1 and protective-film exposed portions a2 of the panel terminal unit 60B illustrated in FIG. 8A.

Figure 8B:
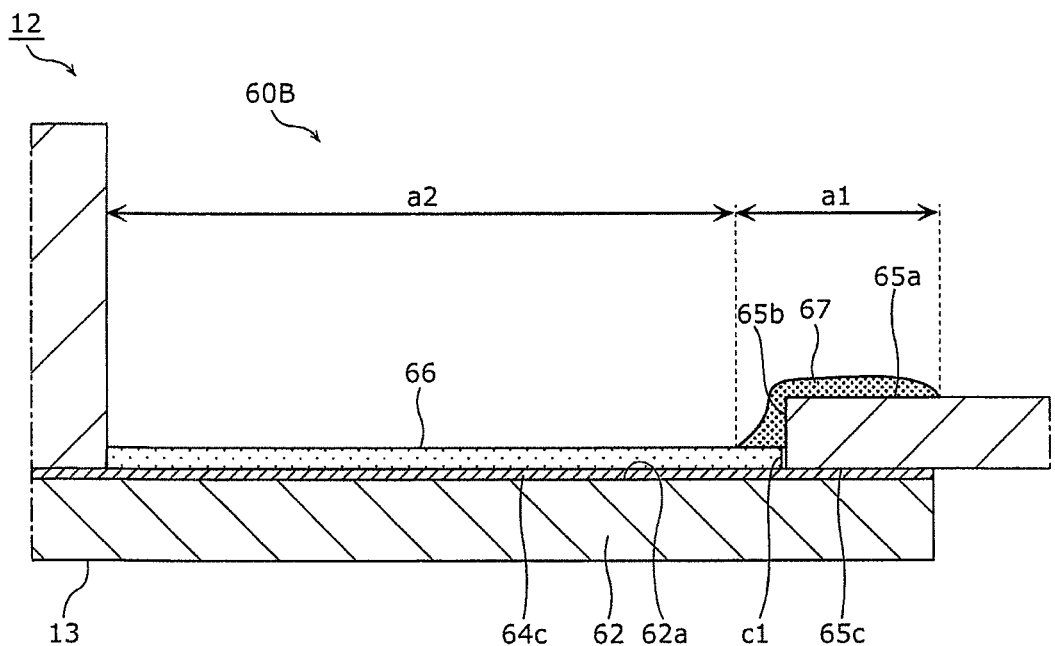
FIG. 8B is a cross-sectional view of the panel terminal unit according to Embodiment 2 taken along VIIIB-VIIIB line of FIG. 8A.
Figure 8C:
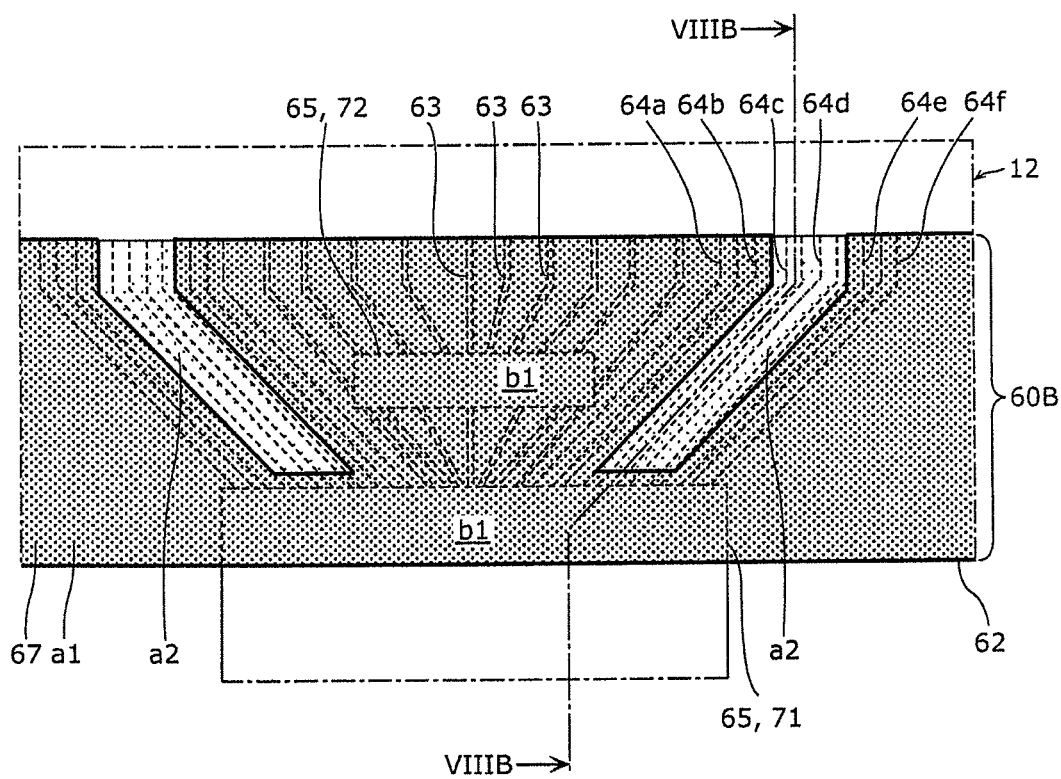
FIG. 8C is a diagram illustrating a resin-covered portion and protective-film exposed portions of the panel terminal unit illustrated in FIG. 8A.

As illustrated in FIG. 8A and FIG. 8B, the panel terminal unit 60B includes, a board 62, a plurality of wiring electrodes 63, and 64a, 64b, 64c, 64d, 64e, and 64f, mounted components 65, a protective film 66, and a resin portion 67.

The board 62 is formed as a portion of the panel board 13 and located in an edge portion of the panel board 13 on one long side of the panel board 13.

The plurality of wiring electrodes 63 and 64a to 64f are provided on the board 62 with small pitches. The plurality of wiring electrodes 63 and 64a to 64f are connected selectively to the plurality of pixel drive circuits 30. Specifically, the wiring electrodes 63 are connected to the pixel drive circuits 30 via the signal lines 42. The wiring electrodes 64 are connected to the pixel drive circuits 30 via the gate drive circuit 14 and the scanning lines 40.

To each of the wiring electrodes 63 and 64a to 64f, predetermined voltages are applied. However, the voltage applied to the wiring electrodes 63 is lower than the voltages applied to the wiring electrodes 64a to 64f because the wiring electrodes 63 are connected to the signal lines 42. Hence, the wiring electrodes 64a to 64f, to which relatively high voltages are applied, will be described.

Table 1 gives connection destinations, levels, and applied voltages of the wiring electrodes 64a to 64f. Connection destinations INI, REF, and WS of the wiring electrodes correspond to the gates of the transistors illustrated in FIG. 2. Levels H (high) and L (low) indicate a high voltage and a low voltage to be switched and input into INI, REF, and WS.

TABLE 1

| Wiring electrode | Destination of wiring electrode | Level | Applied voltage (V) |
| --- | --- | --- | --- |
| 64a | INI | L | −5 |
| 64b | REF | L | −3 |
| 64c | WS | L | −3 |
| 64d | INI | H | 11 |
| 64e | REF | H | 10 |
| 64f | WS | H | 10 |

Whether the wiring electrodes 64a to 64f are brought into or out of conduction to the pixel drive circuits is selected by the gate drive circuit 14. The selection causes one of the voltages H and L to be applied to the gate of each of the transistors INI, REF, and WS.

As illustrated in FIG. 8B, on a side of the board 62 close to its main face 62a, the mounted components 65 such as the flexible printed wiring board 71 and the driver IC 72 are mounted.

The mounted component 65 includes a top face 65a, side faces 65b, and a bottom face 65c. The mounted component 65 is mounted on the board 62 in such a manner that its external terminal provided on the bottom face 65c is connected to a plurality of wiring electrodes 63 and 64a to 64f.

The protective film 66 is, for example, a silicon nitride film and formed by the CVD. The protective film 66 is provided on the board 62 in such a manner as to cover the plurality of wiring electrodes 63 and 64a to 64f except for mounting areas b1 where the mounted component 65 is mounted on the board 62.

After the protective film 66 formed on the board 62, the mounted components 65 are mounted in the mounting areas b1 where the protective film 66 is not formed. Mounting the mounted components 65 involves occurrence of unevenness in mounting accuracy; therefore, a layout of the protective film 66 and the mounted components 65 is designed such that the protective film 66 and the mounted components 65 do not interfere with each other even when the unevenness occurs. Accordingly, there are gaps c1 formed between the protective film 66 and the mounted components 65 after being mounted.

The resin portions 67 are charged between the protective film 66 and the mounted components 65 so as to close these gaps c1. Specifically, the resin portions 67 are formed so as to cover the top face 65a and the side faces 65b of each of the mounted components 65 and the above gaps c1 and to cover portions of the protective film 66. That is, the resin portions 67 are provided in such a manner as to cover the mounted components 65 and cover portions of the protective film 66 and not to cover the rest of the protective film 66.

As illustrated in FIG. 8C, presence and absence of the resin portions 67 on the protective film 66 make the protective film 66 include the resin-covered portion a1, where the protective film 66 is covered with the resin portions 67, and the protective-film exposed portions a2, where the protective film 66 is not covered with the resin portions 67 but exposed. The protective-film exposed portions a2 are provided on at least some of the wiring electrodes 63 and 64a to 64f. Specifically, the protective-film exposed portions a2 are each provided on areas of the wiring electrodes 64c and 64d.

The protective-film exposed portions a2 may be provided on neighboring wiring electrodes that make the largest difference in voltage to be applied to the neighboring wiring electrodes out of the wiring electrodes 64a to 64f. In the present embodiment, the wiring electrodes 64c and 64d make the largest difference in voltage, which is 14 V as given in Table 1. The protective-film exposed portions a2 are therefore provided on the wiring electrodes 64c and 64d. Note that the protective-film exposed portions a2 may be provided on the neighboring wiring electrodes in a case where the neighboring wiring electrodes make a difference in voltage of 9 V or larger.

In addition, the protective-film exposed portions a2 may be provided on neighboring wiring electrodes that have different polarities from the neighboring wiring electrode out of the wiring electrodes 64a to 64f. In the present embodiment, as given in Table 1, the applied voltage of the wiring electrode 64c is negative, and the applied voltage of the wiring electrode 64d is positive, which indicates that the wiring electrodes 64c and 64d have polarities different from each other. Accordingly, the protective-film exposed portions a2 are therefore provided on the wiring electrodes 64c and 64d.

The wiring electrodes 64a to 64f are not necessarily disposed in the order given in Table 1. For example, in a case where the wiring electrodes 64a to 64f given in Table 1 are arranged in an order of 64a, 64d, 64b, 64e, 64c, and 64f from the left, the wiring electrodes 64a and 64d make the largest difference in voltage. In this case, the protective-film exposed portions a2 may be provided on the wiring electrodes 64a and 64d. In addition, voltage differences between neighboring wiring electrodes 64a, 64d, 64b, 64e, 64c, and 64f are all 9 V or larger, and the protective-film exposed portions a2 are therefore provided on the wiring electrodes 64a, 64d, 64b, 64e, 64c, and 64f. In addition, polarities of neighboring wiring electrodes 64a, 64d, 64b, 64e, 64c, and 64f are all different from each other, and the protective-film exposed portions a2 may therefore be provided on the wiring electrodes 64a, 64d, 64b, 64e, 64c, and 64f.

Also in the display device in Embodiment 2, as the resin portions 67 is provided so that the resin portions 67 covers portions of the protective film 66 and do not cover the rest of the protective film 66, areas where the protective film 66 and the resin portions 67 are in contact with each other can be reduced as compared with the comparative example. This enables a reduction in areas that can suffer cracking or peeling in the protective film 66. This can inhibit the outside air containing moisture and the like from penetrating between the protective film 66 and the wiring electrodes 63 and 64a to 64f, which can inhibit corrosion of the wiring electrodes 63 and 64a to 64f.

Alternatively, the protective-film exposed portions a2 may be provided on neighboring wiring electrodes that make the largest difference in voltage to be applied to the neighboring wiring electrodes out of the wiring electrodes 64a to 64f (in the present embodiment, the wiring electrodes 64c and 64d).

For example, when a substance that can cause an electrochemical reaction comes into contact with the wiring electrodes 64c and 64d making a large voltage difference, the substance may hasten the corrosion of the wiring electrodes 64c and 64d. Therefore, occurrence of cracking or peeling of the protective film 66 on the wiring electrodes 64c and 64d facilitates the corrosion of the wiring electrodes 64c and 64d. In contrast, in the present embodiment, the protective-film exposed portions a2 are provided on the wiring electrodes 64c and 64d that make the largest difference in voltage, which enables a structure in which portions of the protective film 66 located on the wiring electrodes 64c and 64d are not covered with the resin portions 67. This can inhibit the occurrence of cracking or peeling in the protective film 66 on the wiring electrodes 64c and 64d. As a result, it becomes difficult for the outside air to penetrate between the protective film 66 and the wiring electrodes 64c and 64d, which can inhibit the corrosion of the wiring electrodes 64c and 64d.

Alternatively, the protective-film exposed portions a2 may be provided on neighboring wiring electrodes that have different polarities from the neighboring wiring electrodes out of the wiring electrodes 64a to 64f (in the present embodiment, the wiring electrodes 64c and 64d).

For example, when a substance that can cause an electrochemical reaction comes into contact with the wiring electrodes 64c and 64d having different polarities, the substance may hasten the corrosion of the wiring electrodes 64c and 64d. Therefore, occurrence of cracking or peeling of the protective film 66 on the wiring electrodes 64c and 64d facilitates the corrosion of the wiring electrodes 64c and 64d. In contrast, in the present embodiment, the protective-film exposed portions a2 are provided on the wiring electrodes 64c and 64d that have different polarities, which enables a structure in which portions of the protective film 66 located on the wiring electrodes 64c and 64d are not covered with the resin portions 67. This can inhibit the occurrence of cracking or peeling in the protective film 66 on the wiring electrodes 64c and 64d. As a result, it becomes difficult for the outside air to penetrate between the protective film 66 and the wiring electrodes 64c and 64d, which can inhibit the corrosion of the wiring electrodes 64c and 64d.

Embodiment 3

Next, a display device according to Embodiment 3 will be described with reference to FIG. 9A and FIG. 9B. In embodiment 3, an example in which a height of resin portions 67 varies between areas where mounted components 65 are present and areas where no mounted component 65 is present will be described.

Figure 9A:
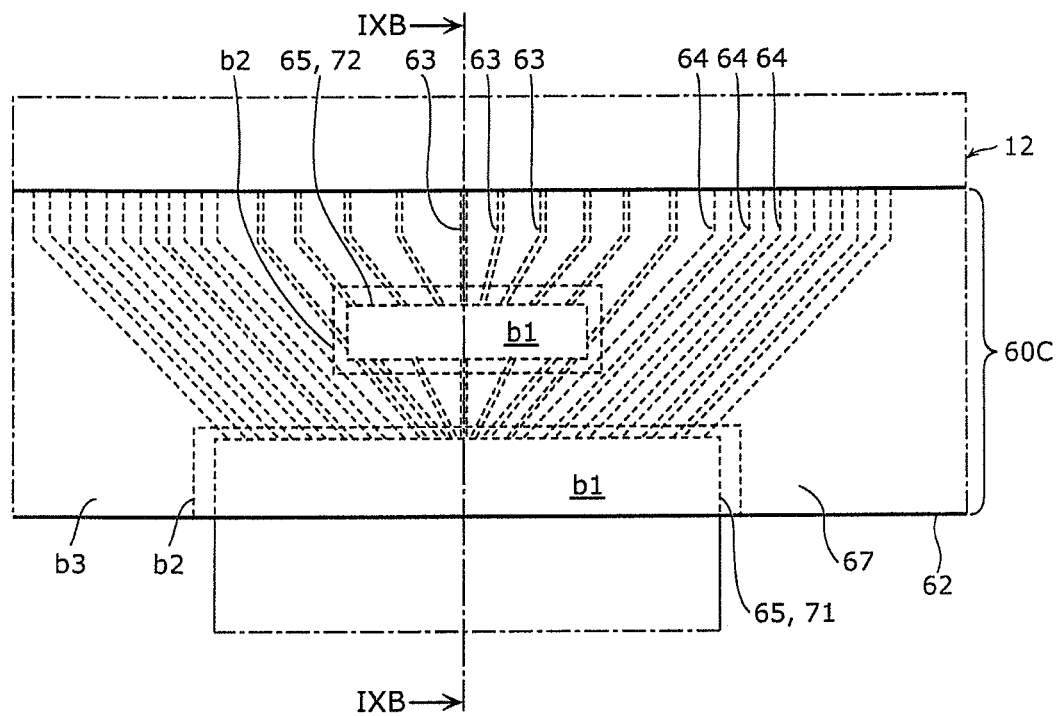
FIG. 9A is a plan view of a part of a panel terminal unit of a display device according to Embodiment 3.

FIG. 9A is a plan view of a part of a panel terminal unit 60C of the display device. FIG. 9B is a cross-sectional view of the panel terminal unit 60C taken along IXB-IXB line of FIG. 9A. FIG. 9C is a diagram illustrating a first resin portion 67a and a second resin portion 67b of the panel terminal unit 60C illustrated in FIG. 9A.

Figure 9B:
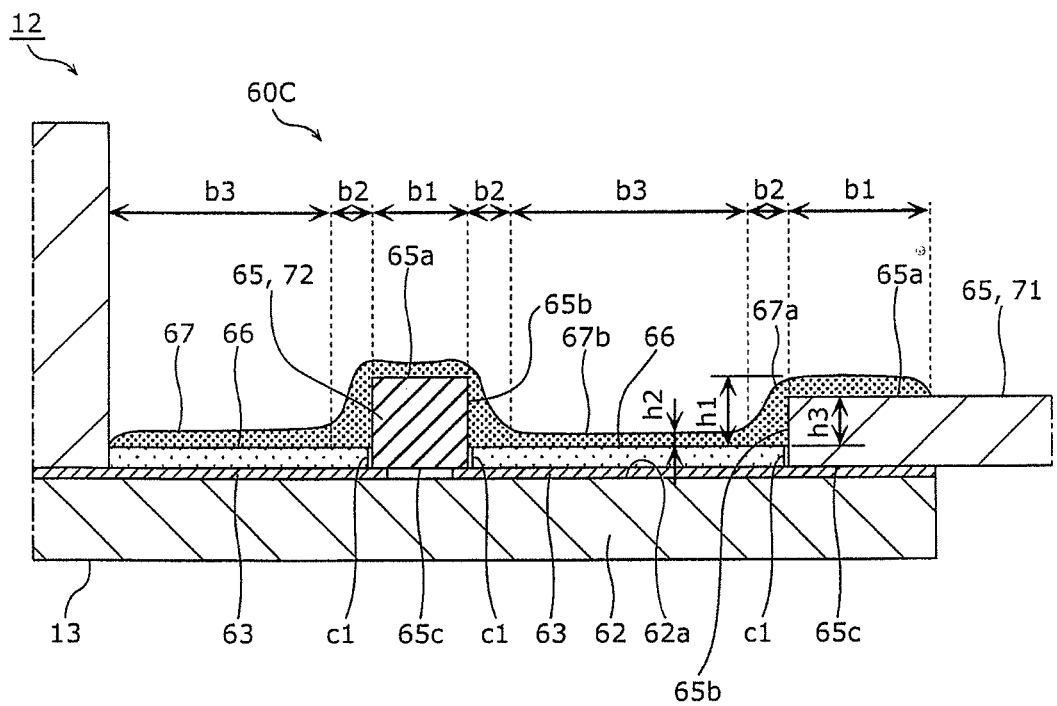
FIG. 9B is a cross-sectional view of the panel terminal unit according to Embodiment 3 taken along IXB-IXB line of FIG. 9A.
Figure 9C:
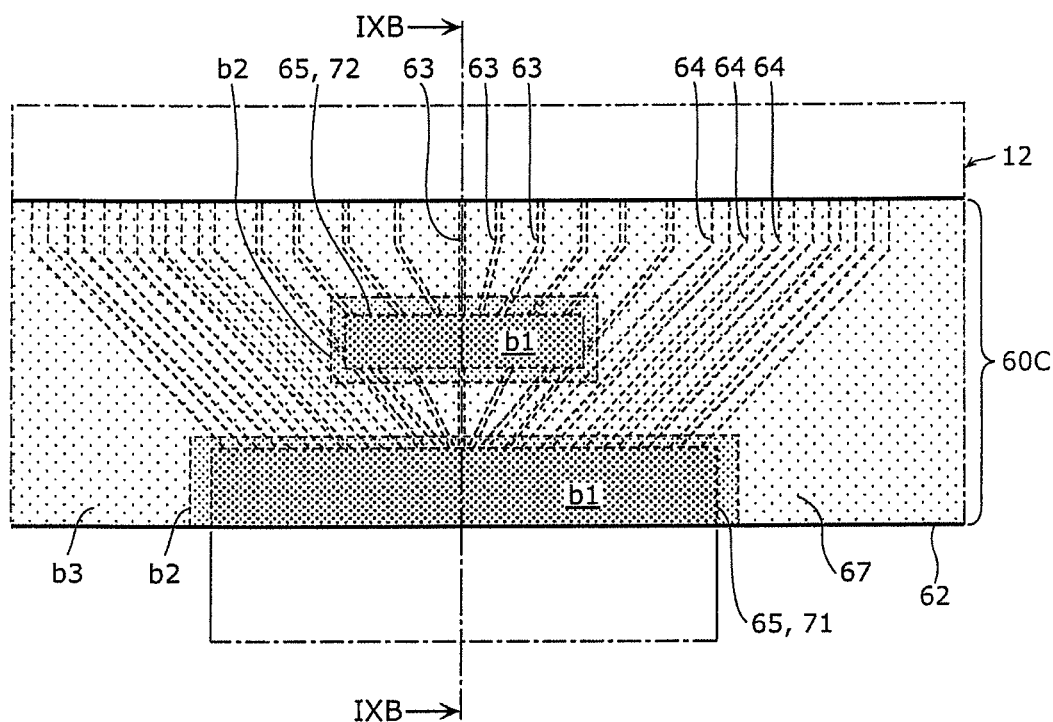
FIG. 9C is a diagram illustrating a first resin portion and a second resin portion of the panel terminal unit illustrated in FIG. 9A.

As illustrated in FIG. 9A and FIG. 9B, the panel terminal unit 60C includes, a board 62, a plurality of wiring electrodes 63 and 64, mounted components 65, a protective film 66, and a resin portion 67.

The board 62 is formed as a portion of the panel board 13 and located in an edge portion of the panel board 13 on one long side of the panel board 13.

The plurality of wiring electrodes 63 and 64 are provided on the board 62 with small pitches. The plurality of wiring electrodes 63 and 64 are connected selectively to the plurality of pixel drive circuits 30. Specifically, the wiring electrodes 63 are connected to the pixel drive circuits 30 via the signal lines 42. The wiring electrodes 64 are connected to the pixel drive circuits 30 via the gate drive circuit 14 and the scanning lines 40.

As illustrated in FIG. 9B, on a side of the board 62 close to its main face 62a, the mounted components 65 such as a flexible printed wiring board 71 and a driver IC 72 are mounted.

The mounted component 65 includes a top face 65a, side faces 65b, and a bottom face 65c. The mounted component 65 is mounted on the board 62 in such a manner that its external terminal provided on the bottom face 65c is connected to a plurality of wiring electrodes 63 and 64.

The protective film 66 is a film for protecting the wiring electrodes 63 and 64 from the outside air. The protective film 66 is, for example, a silicon nitride film and formed by the CVD. The protective film 66 is provided on the board 62 in such a manner as to cover the plurality of wiring electrodes 63 and 64 except for mounting areas b1 where the mounted component 65 is mounted on the board 62.

After the protective film 66 formed on a part of the board 62, the mounted components 65 are mounted in the mounting areas b1. Mounting the mounted components 65 involves occurrence of unevenness in mounting accuracy; therefore, a layout of the protective film 66 and the mounted components 65 is designed such that the protective film 66 and the mounted components 65 do not interfere with each other even when the unevenness occurs. Accordingly, there are gaps c1 formed between the protective film 66 and the mounted components 65 after being mounted.

The resin portion 67 is charged between the protective film 66 and the mounted components 65 so as to close these gaps c1. Specifically, the resin portion 67 is formed so as to cover the top face 65a and the side faces 65b of each of the mounted components 65 and the above gaps c1 and to cover the entire protective film 66. The resin portion 67 may be formed so as to cover portions of the protective film 66.

In addition, as illustrated in FIG. 9C, the resin portion 67 includes the first resin portion 67a that is provided on portions of the protective film 66 located in surrounding areas b2 of the mounted components 65 and the second resin portion 67b that is provided on a portion of the protective film 66 located in an area b3 different from both the mounting areas b1 and the surrounding areas b2.

A height h2 of the second resin portion 67b is less than a height h1 of the first resin portion 67a with respect to the protective film 66. The height h2 of the second resin portion 67b is less than a height h3 of a top face 65a of a mounted component 65 with respect to the protective film 66. As seen from the above, there are the first resin portion 67a having the height h1 and the second resin portion 67b having the height h2 that is less than the height h1 and the height h3 in the panel terminal unit 60C.

Figure 10:
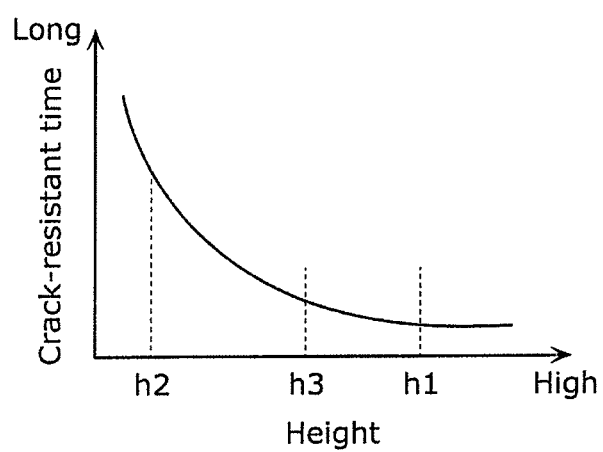
FIG. 10 is a schematic diagram illustrating a relation between a height of a resin portion of the panel terminal unit according to Embodiment 3 and a crack-resistant time.
Figure 11:
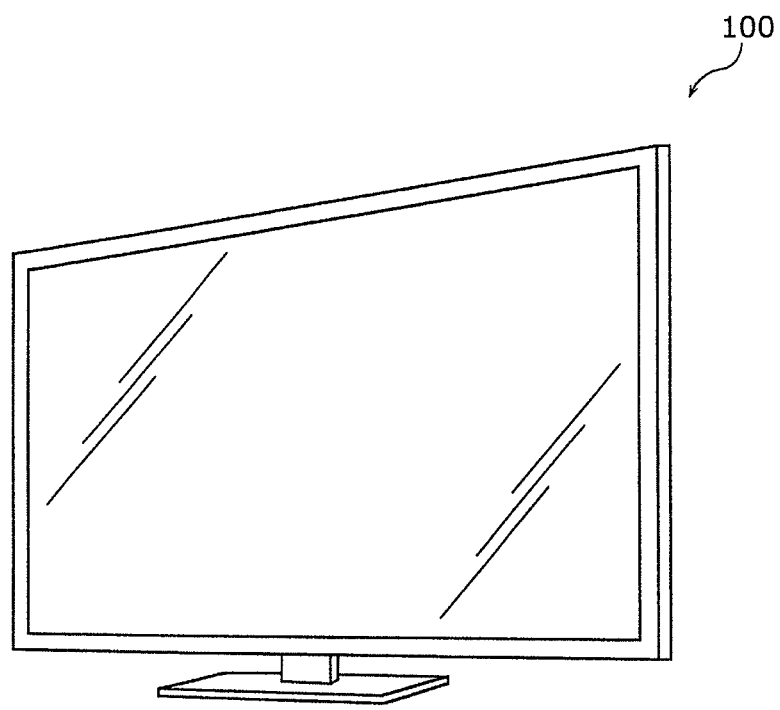
FIG. 11 is an external view of a thin flat television system that is an example of a display device that includes a control device according to an embodiment.

Here, a relation between the height of the resin portion 67 and a crack-resistant time will be described with reference to FIG. 10. FIG. 10 is a schematic diagram illustrating the relation between the height of the resin portion 67 of the panel terminal unit 60C according to Embodiment 3 and the crack-resistant time. The crack-resistant time is a period taken by a crack to occur in the protective film 66 when a damp heat test is performed on the display device. As the crack-resistant time increases, the display device has a longer durability.

FIG. 10 shows that the crack-resistant time increases as the height h2 of the second resin portion 67b, that is, as a thickness of the second resin portion 67b is reduced. A conceivable reason for this is that, as the height h2 of the second resin portion 67b decreases, a swelling amount and a shrinking amount of the resin portion 67 in the damp heat test is reduced, which makes an external force applied to the protective film 66 weak.

The display device in the present embodiment includes: the panel unit 12 that includes a plurality of pixel drive circuits 30; and the panel terminal unit 60C that is disposed on an edge portion of the panel unit 12. Here, the panel terminal unit 60C includes: the board 62; the plurality of wiring electrodes 63, 64 that are disposed on the board 62 and are connected to the plurality of pixel drive circuits 30; the mounted component 65 that is mounted on the board 62 and connected to the plurality of wiring electrodes 63, 64; the protective film 66 that is disposed on the board 62 covers the plurality of wiring electrodes 63, 64 except for a mounting area b1 where the mounted component 65 is mounted on the board 62; and the resin portion 67 that covers the mounted component 65 and a portion or an entirety of the protective film 66. The resin portion 67 includes a first resin portion 67a that is located on a portion of the protective film 66 located in a surrounding area b2 of the mounted component 65 and a second resin portion 67b that is located on another portion of the protective film 66 located in an area b3 different from both the mounting area b1 and the surrounding area b2. A height h2 of the second resin portion 67b is less than a height h1 of the first resin portion 67a with respect to the protective film 66.

By making the height h2 of the second resin portion 67b less than the height h1 of the first resin portion 67a in this manner, a swelling amount and a shrinking amount of the resin portion 67 in the damp heat test is reduced. This can weaken an external force applied to the protective film 66 by the first resin portion 67a, enabling the protective film 66 to inhibit cracking or peeling from occurring. This can inhibit the outside air containing moisture and the like from penetrating between the protective film 66 and the wiring electrodes 63 and 64, which can inhibit corrosion of the wiring electrodes 63 and 64.

It is also possible that the height h2 of the second resin portion 67b is less than a height h3 of a top face 65a of the mounted component 65.

By making the height h2 of the second resin portion 67b less than the height h3 of the top face 65a of the mounted component 65 in this manner, the swelling amount and the shrinking amount of the first resin portion 67a in the damp heat test can be further reduced. This can weaken an external force applied to the protective film 66 by the first resin portion 67a, enabling the protective film 66 to inhibit cracking or peeling from occurring. This can inhibit the outside air containing moisture and the like from penetrating between the protective film 66 and the wiring electrodes 63 and 64, which can inhibit corrosion of the wiring electrodes 63 and 64.

Other Embodiments

It should be noted that the present disclosure is not limited to the configurations according to the above-described embodiments and variations, and any appropriate modifications are possible.

For example, Embodiment 1 and the modification describe an example in which the driver IC 72 is the source driver; however the driver IC 72 is not limited to the source driver and may be a gate driver. That is, the gate driver may be mounted on the panel terminal unit 60 as the mounted component 65 or may be mounted on the flexible printed wiring board 71.

In addition, the gate drive circuit may be disposed on one of short sides of the panel unit, or gate drive circuits may be disposed on two facing short sides of the panel unit. Similarly, the source drive circuit may be disposed on one of long sides of the panel unit, or source drive circuits may be disposed on two facing long sides of the panel unit.

The light emitting device is not limited to the organic light-emitting device and may be another kind of light-emitting device such as an LED.

In addition, in the display device, the configuration of the pixel drive circuit is not limited to the configurations described in the embodiments and the modification described above and may be modified. For example, as long as the configuration includes the drive transistor, the selection transistor, and the pixel capacitor, disposition of the other components, the switch transistors, may be changed as appropriate. The plurality of transistors provided in the pixel drive circuit may be formed of polysilicon TFTs or may be formed of another kind of transistors such as amorphous silicon TFTs. In addition, the conductivity types of the transistors may be of either an N-channel type or a P-channel type, or may be a combination thereof.

Furthermore, various modifications of the embodiments and the variations which those skilled in the art can conceive or desirable combinations of the structural elements and functions in the embodiments and the variations without materially departing from the present disclosure are also included in the present disclosure. For example, the present disclosure includes a thin flat television system 100, a game device having the display panel, and a monitoring system for a personal computer, as examples of the display device including the control device according to the present disclosure.

INDUSTRIAL APPLICABILITY

The present disclosure is useful in a technical field of a display or the like for which an environment resistance or a durability is particularly demanded.

The invention claimed is:
1. A display device, comprising:
a panel that includes a plurality of pixel drive circuits; and
a panel terminal that is disposed on an edge portion of the panel,
wherein the panel terminal includes
a board;

a plurality of wiring electrodes that are disposed on the board and are connected to the plurality of pixel drive circuits;

a mounted component that is mounted on the board and connected to the plurality of wiring electrodes;

a protective film that is disposed on the board and covers the plurality of wiring electrodes except for a mounting area where the mounted component is mounted on the board; and a resin portion that covers the mounted component and a portion of the protective film and not covers a rest of the protective film, wherein the protective film includes a resin-covered portion covered with the resin portion and a protective-film exposed portion not covered with the resin portion.

2. The display device according to claim 1,
wherein the protective-film exposed portion is disposed on at least a part of the plurality of wiring electrodes.

3. The display device according to claim 1,
wherein the protective-film exposed portion is located on neighboring wiring electrodes that make a largest difference in a voltage applied to the neighboring wiring electrodes out of the plurality of wiring electrodes.

4. The display device according to claim 1,
wherein the protective-film exposed portion is located on neighboring wiring electrodes that have different polarities out of the plurality of wiring electrodes.

5. A display device, comprising:
a panel that includes a plurality of pixel drive circuits; and
a panel terminal that is disposed on an edge portion of the panel,
wherein the panel terminal includes
a board;
a plurality of wiring electrodes that are disposed on the board and are connected to the plurality of pixel drive circuits;
a mounted component that is mounted on the board and connected to the plurality of wiring electrodes;
a protective film that is disposed on the board and covers the plurality of wiring electrodes except for a mounting area where the mounted component is mounted on the board; and
a resin portion that covers the mounted component and a portion of the protective film and not covers a rest of the protective film,
wherein an area of the resin portion is 1.1 times or larger and 3 times or smaller an area of the mounting area.

6. A display device, comprising:
a panel that includes a plurality of pixel drive circuits; and
a panel terminal that is disposed on an edge portion of the panel,
wherein the panel terminal includes
a board;
a plurality of wiring electrodes that are disposed on the board and are connected to the plurality of pixel drive circuits;
a mounted component that is mounted on the board and connected to the plurality of wiring electrodes;
a protective film that is disposed on the board covers the plurality of wiring electrodes except for a mounting area where the mounted component is mounted on the board; and
a resin portion that covers the mounted component and a portion or an entirety of the protective film,
wherein the resin portion includes a first resin portion that is located on a portion of the protective film located in a surrounding area of the mounted component and a second resin portion that is located on another portion of the protective film located in an area different from both the mounting area and the surrounding area, and
a height of the second resin portion is less than a height of the first resin portion with respect to the protective film.

7. The display device according to claim 6,
wherein the height of the second resin portion is less than a height of a top face of the mounted component.

8. A display device, comprising:
a panel that includes a plurality of pixel drive circuits; and
a panel terminal that is disposed on an edge portion of the panel,
wherein the panel terminal includes
a board;
a plurality of wiring electrodes that are disposed on the board and are connected to the plurality of pixel drive circuits;
a mounted component that is mounted on the board and connected to the plurality of wiring electrodes;
a protective film that is disposed on the board and covers the plurality of wiring electrodes except for a mounting area where the mounted component is mounted on the board; and
a resin portion that covers the mounted component and a portion of the protective film and not covers a rest of the protective film,
wherein the protective film and the mounted component have a gap, and the resin portion closes the gap.

9. A display device, comprising:
a panel that includes a plurality of pixel drive circuits; and
a panel terminal that is disposed on an edge portion of the panel,
wherein the panel terminal includes
a board;
a plurality of wiring electrodes that are disposed on the board and are connected to the plurality of pixel drive circuits;
a mounted component that is mounted on the board and connected to the plurality of wiring electrodes;
a protective film that is disposed on the board and covers the plurality of wiring electrodes except for a mounting area where the mounted component is mounted on the board; and
a resin portion that covers the mounted component and a portion of the protective film and not covers a rest of the protective film,
wherein the mounted component is at least one of a flexible printed wiring board and a driver integrated circuit (IC).

10. A display device, comprising:
a panel that includes a plurality of pixel drive circuits; and
a panel terminal that is disposed on an edge portion of the panel,
wherein the panel terminal includes
a board;
a plurality of wiring electrodes that are disposed on the board and are connected to the plurality of pixel drive circuits;
a mounted component that is mounted on the board and connected to the plurality of wiring electrodes;
a protective film that is disposed on the board and covers the plurality of wiring electrodes except for a mounting area where the mounted component is mounted on the board; and a resin portion that covers the mounted component and a portion of the protective film and not covers a rest of the protective film; and a driver circuit board that supplies a drive current for driving the plurality of pixel drive circuits, wherein the mounted component is a flexible printed wiring board, and the panel terminal is connected to the driver circuit board via the flexible printed wiring board.

* * * * *